(12) United States Patent
Takayashiki

(10) Patent No.: US 8,483,314 B2
(45) Date of Patent: Jul. 9, 2013

(54) WIRELESS APPARATUS AND DISTORTION COMPENSATION METHOD USED ON TIME DIVISION DUPLEX SYSTEM

(75) Inventor: Takumi Takayashiki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 598 days.

(21) Appl. No.: 12/726,325

(22) Filed: Mar. 17, 2010

(65) Prior Publication Data
US 2010/0239047 A1 Sep. 23, 2010

(30) Foreign Application Priority Data

Mar. 18, 2009 (JP) ................. 2009-066935

(51) Int. Cl.
*H04K 1/02* (2006.01)

(52) U.S. Cl.
USPC ........... 375/296; 375/135; 375/146; 375/260; 375/262; 375/267; 375/224; 375/297

(58) Field of Classification Search
USPC ................. 375/280, 296, 135, 146, 260, 262, 375/267, 224, 297, 295; 370/203, 204, 205, 370/208, 209, 210
See application file for complete search history.

(56) References Cited

U.S. PATENT DOCUMENTS

| | | | |
|---|---|---|---|
| 5,903,823 A | 5/1999 | Moriyama | |
| 6,081,698 A | 6/2000 | Moriyama | |
| 6,091,941 A | 7/2000 | Moriyama | |
| 6,774,834 B2 * | 8/2004 | Dartois | 341/144 |
| 7,456,688 B2 | 11/2008 | Okazaki | |
| 7,907,678 B2 * | 3/2011 | Mizuta et al. | 375/297 |
| 7,944,295 B2 * | 5/2011 | Hongo et al. | 330/149 |
| 2007/0241816 A1 * | 10/2007 | Okazaki et al. | 330/149 |
| 2008/0144539 A1 * | 6/2008 | Sperlich et al. | 370/278 |

FOREIGN PATENT DOCUMENTS

| | | |
|---|---|---|
| EP | 1819038 A1 | 8/2007 |
| JP | H09-153849 A | 6/1997 |
| JP | 2004-221862 A | 8/2004 |
| WO | WO-2006/059372 | 6/2006 |

OTHER PUBLICATIONS

European Office Action dated May 9, 2012 for corresponding European Application No. 10155830.2.
"Extended European Search Report from EPO," mailed by EPO and corresponding to European application No. 10155830.2 on Feb. 4, 2011, 7 pages.
Japanese Office Action mailed Nov. 27, 2012 for corresponding Japanese Application No. 2009-066935, with Partial English-language Translation.

* cited by examiner

*Primary Examiner* — Dhaval Patel
(74) *Attorney, Agent, or Firm* — Fujitsu Patent Center

(57) ABSTRACT

There is provided a wireless apparatus in which a distortion compensation loop is formed so as to compensate nonlinear distortion of a transmission amplifier, being used on a time division duplex system on which a wireless signal is transmitted in a transmission time period with same frequency as being received, the wireless apparatus used on the time division duplex system including a combining section to combine a feedback signal into which a return signal generated by reflection of a transmission signal at a antenna leaks and the return signal processed by a reception unit to process a reception signal from the antenna in the transmission time period so as to cancel the return signal leaked into the feedback signal.

2 Claims, 11 Drawing Sheets

INSERTION LOSS: L = 10 log (P2/P1) [dB]

COUPLING: C = 10 log (P4/P1) [dB]

ISOLATION: I = 10 log (P3/P1) [dB]

DIRECTION: D = 10 log (P3/P4) [dB]

INSERTION LOSS: 10 log (P2/P1), 10 log (P3/P2)   [dB]
BACKWARD INSERTION LOSS: 10 log (P1/P2), 10 log (P2/P3)   [dB]

WIRELESS APPARATUS AND DISTORTION COMPENSATION METHOD USED ON TIME DIVISION DUPLEX SYSTEM

CROSS-REFERENCE TO RELATED APPLICATION

This application is based upon and claims the benefit of priority of the prior Japanese Patent Application No. 2009-066935, filed on Mar. 18, 2009, the entire contents of which are incorporated herein by reference.

FIELD

The embodiments discussed herein are related to a wireless apparatus and a distortion compensation method used on a time division duplex system.

BACKGROUND

For wireless communication apparatuses using a multiphase shift keying modulation system for a high efficiency transmission, significant design conditions for reducing power leakage to adjacent channels by reducing nonlinear distortion of a power amplifier in a transmission unit (hereinafter, described as a "transmission amplifier" in some cases) are provided. For example, in a case in which a channel uses a frequency at a boundary of a frequency band assigned to a carrier, noise occurs to adjacent channels for other carriers because of power leakage from the channel in a wireless communication.

Distortion compensation amplifiers that compensate for nonlinear distortion employ a pre-distortion technique in some cases. In the pre-distortion technique, a transmission signal is corrected in advance using data having characteristics inverse to characteristics of nonlinear distortion (hereinafter, described as "distortion compensation data" in some cases). The corrected signal is used as a signal to be input to a transmission amplifier. Furthermore, in the pre-distortion technique, in order to update the distortion compensation data for changes that occurred in the transmission amplifier over time, one portion of the transmission signal amplified by the transmission amplifier is fed back. The transmission signal is compared with the transmission signal prior to being corrected using the distortion compensation data, and the distortion compensation data are updated. Hereinafter, a loop system including the transmission amplifier and a feedback system that are used to update the distortion compensation data is described as a "distortion compensation loop" in some cases.

Accordingly, a signal that is fed back in the distortion compensation loop (hereinafter, described as a "feedback signal" in some cases) is required that the signal has characteristics of an output signal of the transmission amplifier.

However, the transmission signal is reflected by an antenna because of fluctuation in load imposed on the antenna that is caused by deterioration of conditions for placing the antenna or the like. Then, in some cases, the reflected transmission signal (hereinafter, described as a "return signal" in some cases) leaks into the distortion compensation loop. Accordingly, the feedback signal is not considered as a signal that is obtained in consideration of the output signal of the transmission amplifier. As a technique for solving the above-mentioned problem, a technique is disclosed, in which a vector adjustment circuit capable of performing phase adjustment or amplitude adjustment is provided, and in which cancellation of a return signal that has leaked into a feedback signal is performed (see International Publication Pamphlet No. WO2006/059372).

SUMMARY

A wireless apparatus in which a distortion compensation loop is formed so as to compensate nonlinear distortion of a transmission amplifier, being used on a time division duplex system on which a wireless signal is transmitted in a transmission time period with same frequency as being received, the wireless apparatus used on the time division duplex system including a combining section to combine a feedback signal into which a return signal generated by reflection of a transmission signal at a antenna leaks and the return signal processed by a reception unit to process a reception signal from the antenna in the transmission time period so as to cancel the return signal leaked into the feedback signal.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1:
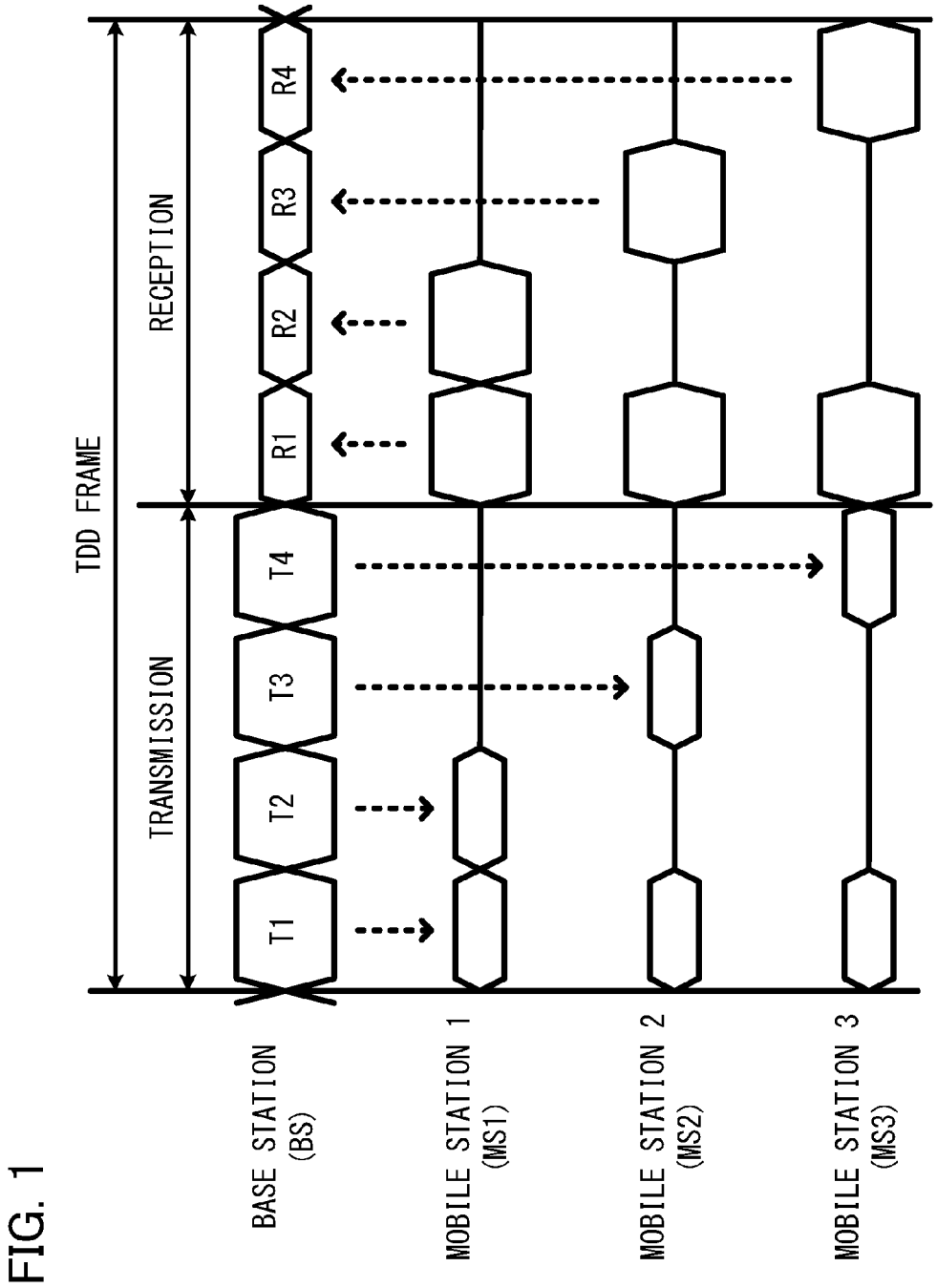
FIG. 1 is a diagram for explaining a time division duplex system (TDD system)

Hereinafter, embodiments will be described with reference to the drawings. Note that, in the drawings, elements that are the same as or similar to each other are denoted by the same referential numerals.

In the distortion compensation amplifiers using the pre-distortion technique, it is necessary to prevent the distortion compensation data from being incorrectly updated using the return signal that has leaked into the distortion compensation loop. First, a time division duplex system (TDD system) and nonlinear distortion will be described.

FIG. 1 is a diagram for explaining a TDD system. For example, a base station (BS) and mobile stations (MS) 1 to 3 exist in the same cell. The base station (BS) and the mobile stations (MS) 1 to 3 alternately perform transmission and reception of signals therebetween at different timings in TDD frames using the same frequency. FIG. 1 illustrates a four-channel multiplexing multicarrier system. Each of the TDD frames is divided into a transmission time period, in which communication in a downward direction from the base station (BS) to a mobile station (MS) is performed, and a reception time period, in which communication in an upward direction from a mobile station (MS) to the base station (BS). Four time slots are assigned to each of the transmission time period and the reception time period. For example, time slots T1 to T4 are assigned to the transmission time period, and time slots R1 to R4 are assigned to the reception time period. The time slots T1 and R1 are control channels, and are used to perform transmission/reception of a control signal between the base station (BS) and each of the mobile stations (MS) in a corresponding one of the TDD frames. In other words, in the control channel of a first TDD frame, the base station (BS) and the mobile station 1 (MS1) perform transmission/reception of a control signal therebetween. In the control channel of a second TDD frame, the base station (BS) and the mobile station 2 (MS2) perform transmission/reception of a control signal therebetween. In the control channel of a third TDD frame, the base station (BS) and the mobile station 3 (MS3) perform transmission/reception of a control signal therebetween. The time slots T2 to T4 and R2 to R4 are communication channels. In the communication channels, the base station (BS) and each of the mobile stations (MS) perform transmission/reception of communication signals therebetween in a corresponding one of the TDD frames.

Figure 2A:
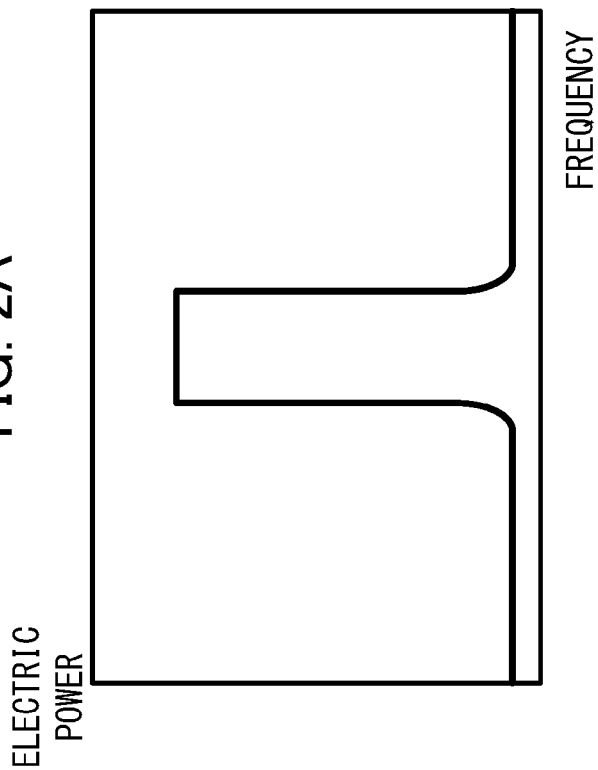
FIGS. 2A to 2B are diagrams illustrating frequency spectra of a transmission signal for explaining influence of nonlinear distortion.
Figure 2B:
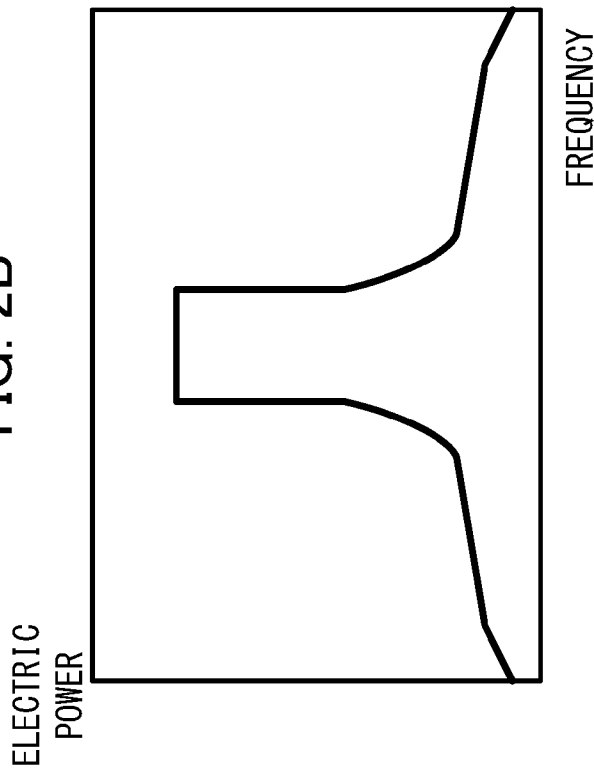

FIGS. 2A to 2B are diagrams illustrating frequency spectra of a transmission signal for explaining influence of nonlinear distortion, and illustrate a case in which the transmission signal is transmitted as one carrier wave. FIG. 2A is a frequency spectrum of the transmission signal in a case in which nonlinear distortion did not occur. FIG. 2B is a frequency spectrum of the transmission signal in a case in which nonlinear distortion occurred. As illustrated in FIG. 2B, in a case in which nonlinear distortion occurred, the side-lobes of the spectrum are raised. Accordingly, because power leaking into adjacent channels increases, the communication quality of the adjacent channels is reduced.

As a distortion compensation amplifier that compensates for the nonlinear distortion, a distortion compensation amplifier using a pre-distortion technique exists. In the pre-distortion technique, a transmission signal to be input to a transmission amplifier is corrected in advance, for nonlinear distortion which is to occur in the transmission amplifier, using distortion compensation data having characteristics that are inverse to the characteristics of the nonlinear distortion. In the distortion compensation amplifier using the pre-distortion technique, the characteristics of the nonlinear distortion change because of changes that occurred in the transmission amplifier over time. For this reason, updating of the distortion compensation data is necessary. In order to update the distortion compensation data, one portion of the transmission signal that is an output signal of the transmission amplifier and that has been corrected using the distortion compensation data is fed back as a feedback signal. The feedback signal is compared with the transmission signal prior to being corrected using the distortion compensation data to obtain a comparison result. The distortion compensation data stored in a distortion compensation table are updated in accordance with the comparison result.

A reflected signal (a return signal) occurs because the transmission signal is reflected by an antenna, and the reflected signal leaks into the feedback signal. Accordingly, there is a problem that the distortion compensation data stored in the distortion compensation table are incorrectly updated using the feedback signal. Next, a wireless apparatus used on the TDD system for solving the above-mentioned problem will be described.

First Embodiment

Figure 3:
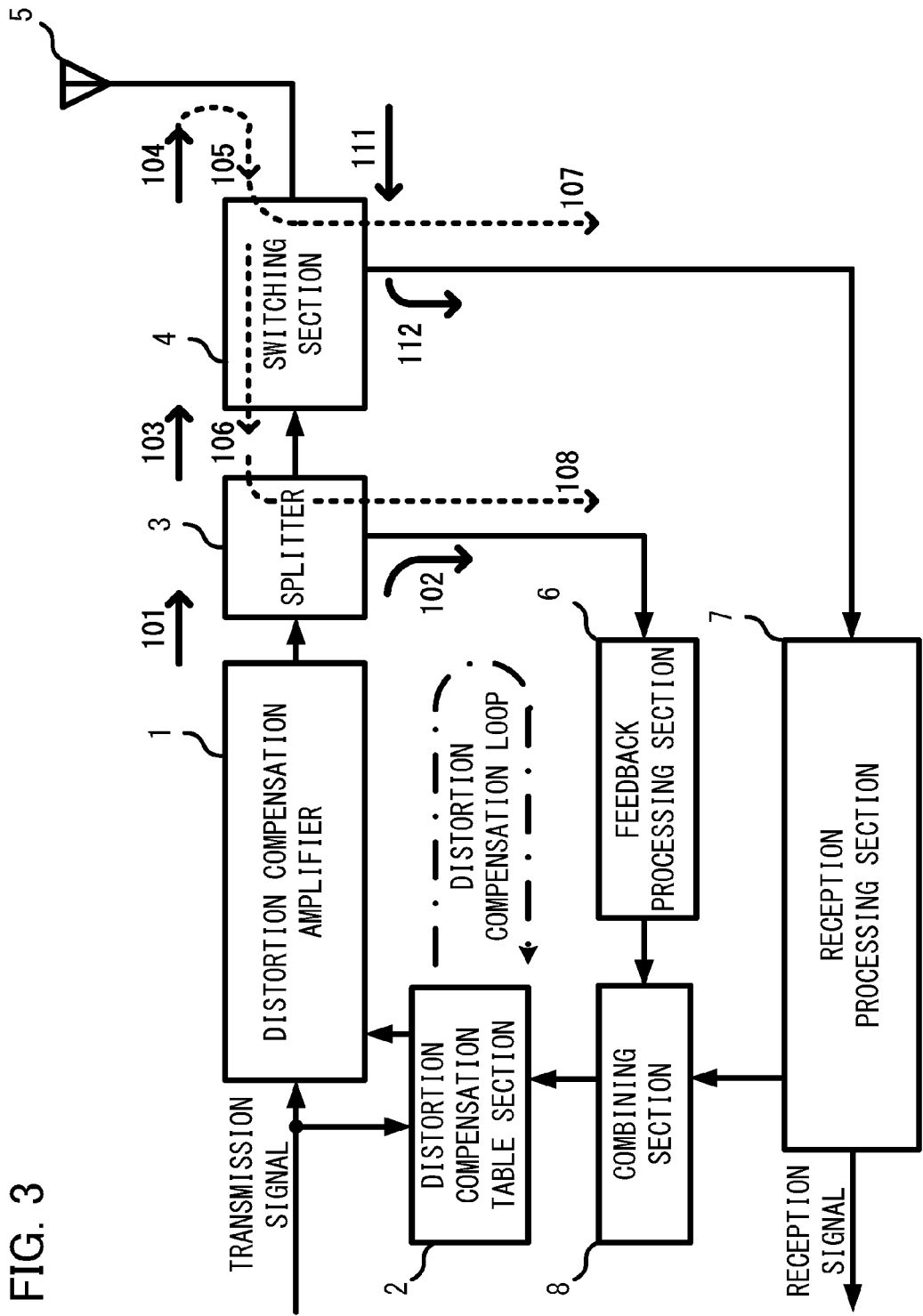
FIG. 3 is a diagram for explaining a wireless apparatus used on the TDD system according to a first embodiment.

FIG. 3 is a diagram illustrating a wireless apparatus used on the TDD system. The wireless apparatus includes a distortion compensation amplifier 1, a distortion compensation table section 2, a splitter 3, a switching section 4, an antenna 5, a feedback processing section 6, a reception processing section 7, and a combining section 8.

Arrows 101 to 104 illustrated in FIG. 3 indicate a transmission signal that is amplified by the distortion compensation amplifier 1. Arrows 105 to 108 indicate a return signal that occurs because the transmission signal 104 is reflected by the antenna 5. Arrows 111 and 112 indicate a reception signal that is received by the antenna 5. The return signal is indicated using the dotted line.

The following transmission processing is performed in the transmission time period in the TDD system. The transmission signal is input to the distortion compensation amplifier 1. The distortion compensation amplifier 1 corrects the transmission signal using a distortion compensation data that is notified from the distortion compensation table section 2, and amplifies the corrected transmission signal so that the transmission signal will have a predetermined level. The distortion compensation table section 2 stores distortion compensation data corresponding to levels of the transmission signal, and notifies the distortion compensation amplifier 1 of the distortion compensation data corresponding to a level of the transmission signal that has been input. The splitter 3 splits the transmission signal 101, which has been amplified by the distortion compensation amplifier 1, into the transmission signal 103 to be transferred in a transmission direction toward the antenna 5 and the transmission signal 102 (hereinafter, described as a "feedback signal" in some cases) to be transferred to a distortion compensation loop. The transmission signal 103 is obtained by splitting with the insertion loss of the splitter 3, and the transmission signal 102 is obtained by splitting with a loss corresponding to the degree of coupling of the splitter 3. The switching section 4 transfers, in the transmission direction, the transmission signal 103 that has been obtained by splitting performed by the splitter 3. The antenna 5 emits, as a wireless signal, the transmission signal 104 that has been transferred by the switching section 4.

The following reception processing is performed in the reception time period in the TDD system. The antenna 5 receives a reception wave, and transfers the reception signal 111. The switching section 4 transfers the reception signal 111 to the reception processing section 7 in a reception direction. The reception processing section 7 performs reception processing on the reception signal 112 that has been transferred by the switching section 4, and outputs the reception signal 112 as a reception signal.

Accordingly, it is preferable that the splitter 3 be a directional coupler which transfers most of the transmission signal from the distortion compensation amplifier 1 to the switching section 4 in the transmission direction, and which transfers one portion of the transmission signal as the feedback signal to the feedback processing section 6. It is preferable that the switching section 4 be a circulator which transfers the transmission signal from the splitter 3 to the antenna 5 in the transmission direction, and which transfers the reception signal from the antenna 5 to the reception processing section 7 in the reception direction.

Furthermore, in the transmission time period in the TDD system, one portion of the transmission signal 104 is reflected by the antenna 5, so that the return signal 105 occurs. The reflection is caused by the mismatch between the characteristic impedance of a feeding line in which the transmission signal 104 is transmitted (a line connecting the switching section 4 and the antenna 5 illustrated in FIG. 3) and the characteristic impedance of the antenna 5. Most of the return signal 105 is transferred as the return signal 107 to the reception processing section 7 in the reception direction. However, one portion of the return signal 105 leaks into a transmission path, along which the transmission signal is transferred, of the switching section 4. The one portion of the return signal 105, i.e., the return signal 106, leaks into the splitter 3. The return signal 106 that has leaked into the splitter 3, i.e., the return signal 108, leaks into the feedback signal 102.

In the transmission time period in the TDD system, the feedback processing section 6 performs reception processing on the feedback signal 102 into which the return signal 108 has leaked. Furthermore, the reception processing section 7 performs reception processing on the return signal 107. The combining section 8 receives the feedback signal, into which the return signal has leaked and which has been subjected to reception processing by the feedback processing section 6, and the return signal which has been subjected to reception processing by the reception processing section 7. The combining section 8 combines the feedback signal with the return signal supplied from the reception processing section 7 as described below.

The combining section 8 adjusts the delay of either of the feedback signal and the return signal which has been subjected to reception processing by the reception processing section 7 so that the timing of the feedback signal and the timing of the return signal will coincide with each other. Next, the combining section 8 adjusts the phase and level of the return signal so that the phase and level of the feedback signal and the phase and level of the return signal will coincide with each other. For example, adjustment of the phase of the return signal is performed by a phase shifter, and adjustment of the level of the return signal is performed by an attenuator. The combining section 8 combines the feedback signal with the return signal, the feedback signal and the reception signal having been subjected to timing, phase, and level adjustment, thereby generating the feedback signal from which the return signal is removed.

Note that, for example, the timing adjustment performed on the feedback signal or the reception signal may be performed by assuming the transmission/reception timings in the TDD frame described with reference to FIG. 1 to be a reference point. A phase shift amount for phase adjustment using the phase shifter and an attenuation for level adjustment using the attenuator are set in advance in consideration of phase conditions and level conditions based on design conditions including conditions for placing the antenna. The phase adjustment and the level adjustment may be performed using the phase shift amount and the attenuation, respectively.

The distortion compensation table section 2 compares, with the transmission signal that has been input, the feedback signal that has been generated by the combining section 8 to obtain a comparison result, and updates the distortion compensation data in accordance with the comparison result.

Figure 4:
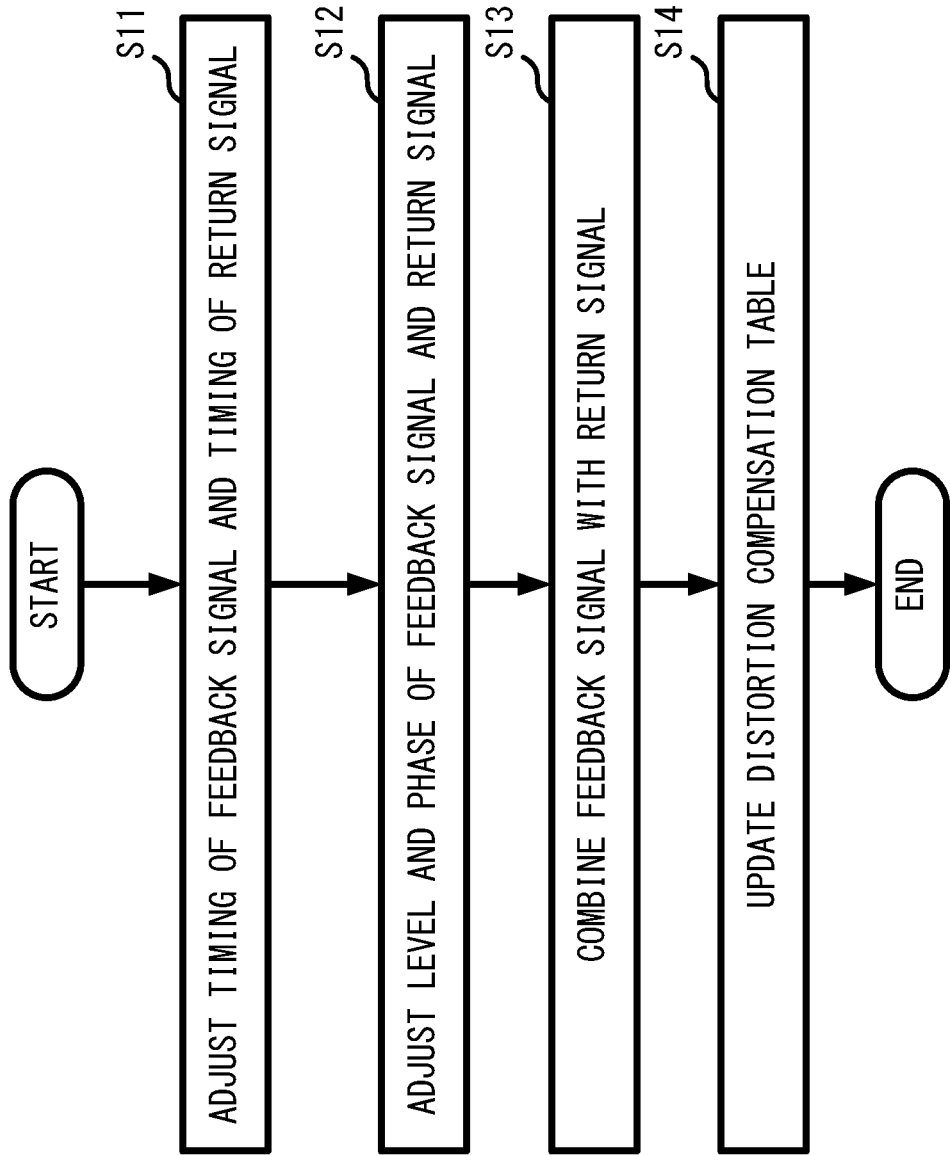
FIG. 4 is a flowchart of a distortion compensation flow for explaining a distortion compensation method for the wireless apparatus used on the TDD system according to the first embodiment.

FIG. 4 is a flowchart of a distortion compensation flow for explaining a distortion compensation method for the wireless apparatus used on the TDD system.

S11: Regarding the feedback signal processed by the feedback processing section 6 and the return signal processed by the reception processing section 7 illustrated in FIG. 3, which timing is earlier, the timing of the feedback signal or the timing of the return signal, and the delay of the signal whose timing is the earlier timing is adjusted so that the timing of the feedback signal and the timing of the return signal will coincide with each other.

S12: Regarding the feedback signal and the return signal which have been subjected to timing adjustment in step S11 so that the timing of the feedback signal and the timing of the return signal have coincided with each other, the level and phase of the return signal processed by the reception processing section 7 is adjusted so that the level and phase of the return signal processed by the reception processing section 7 will coincide with the level and phase of the return signal which has leaked into the feedback signal.

S13: The feedback signal is combined with the reception signal that has been adjusted in step S12, thereby the return signal that has leaked into the feedback signal is removed.

S14: The feedback signal that has been combined in step S13 is compared with the transmission signal that has been input to obtain a comparison result. The distortion compensation data stored in the distortion compensation table are calculated and updated based on the comparison result.

According to the first embodiment, using the reception processing section that processes the reception signal in the reception time period in the TDD system, reception processing is performed on the return signal in the transmission time period, whereby the return signal that is a signal reflected by the antenna is identified. The identified return signal is combined with the feedback signal in the distortion compensation loop. Accordingly, the return signal that has leaked into the feedback signal is removed, and the distortion compensation data is prevented from being incorrectly updated using the return signal that has leaked into the distortion compensation loop.

Second Embodiment

Figure 5:
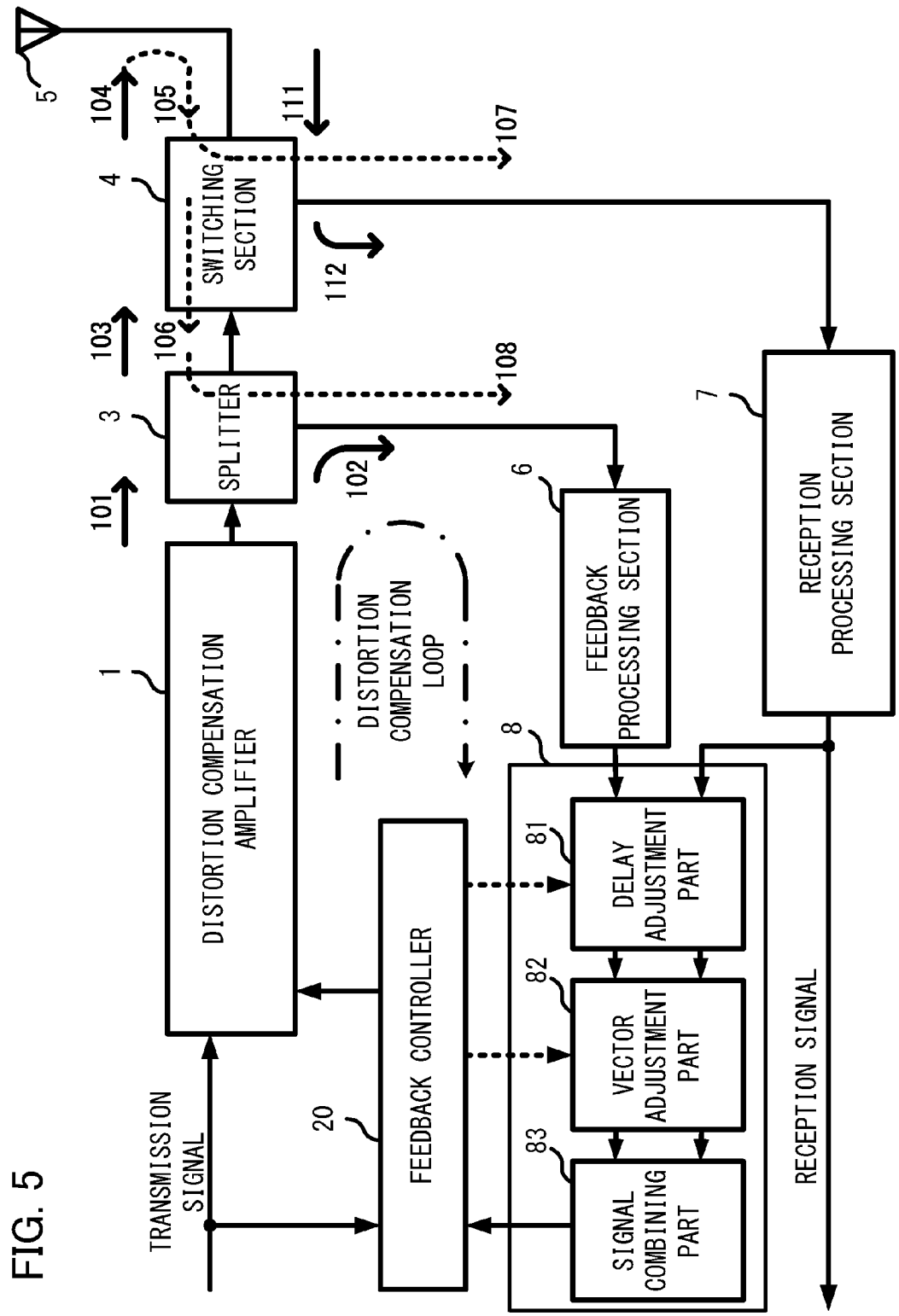
FIG. 5 is a diagram for explaining a wireless apparatus used on the TDD system according to a second embodiment.

FIG. 5 is a diagram for explaining a wireless apparatus used on the TDD system. The wireless apparatus includes a distortion compensation amplifier 1, a feedback controller 20, a splitter 3, a switching section 4, a feedback processing section 6, a reception processing section 7, and a combining section 8. The combining section 8 corresponds to the combining section 8 illustrated in FIG. 3, and includes a delay adjustment part 81, a vector adjustment part 82, and a signal combining part 83. The arrows 101 to 108, 111, and 112 illustrated in FIG. 5 are the same as those illustrated in FIG. 3.

The following transmission processing is performed in the transmission time period in the TDD system.

A transmission signal is input to the distortion compensation amplifier 1. The distortion compensation amplifier 1 corrects the transmission signal using a distortion compensation data that is notified from the feedback control section 20, i.e., using a distortion compensation data that is read by the feedback control section 20 from a distortion compensation table in correspondence with a level of the transmission signal. Then, the distortion compensation amplifier 1 converts the corrected transmission signal into an analog signal, and performs orthogonal modulation using a carrier wave and using a carrier wave having a phase that is shifted by 90 degrees from the phase of the above-mentioned carrier wave, thereby obtaining an orthogonal modulation signal. The distortion compensation amplifier 1 converts the frequency of the orthogonal modulation signal into a transmission frequency, and amplifies the orthogonal modulation signal so that the orthogonal modulation signal will have a predetermined level, thereby generating the transmission signal 101.

The splitter 3 splits the transmission signal 101, which has been generated by the distortion compensation amplifier 1, into the transmission signal 103 to be transferred in a transmission direction toward an antenna and the feedback signal 102 to be transferred to a distortion compensation loop. The transmission signal 103 is obtained by splitting with the insertion loss of the splitter 3, and the feedback signal 102 is obtained by splitting with a loss corresponding to the degree of coupling of the splitter 3. The switching section 4 transfers, in the transmission direction, the transmission signal 103 that has been obtained by splitting performed by the splitter 3. The antenna 5 emits, as a wireless signal, the transmission signal 104 that has been transferred by the switching section 4.

In the transmission time period in the TDD system, the feedback processing section 6 performs reception processing on the feedback signal 102 into which the return signal 108 has leaked. In other words, the feedback processing section 6 performs frequency conversion (down-conversion) on the feedback signal 102 by mixing with the feedback signal 102 using an oscillation signal that is generated by a local oscillator (not illustrated). Then, the feedback processing section 6 performs orthogonal demodulation processing and digital conversion processing.

In the transmission time period in the TDD system, the reception processing section 7 attenuates the return signal 107 so that the return signal 107 will have a predetermined level, and performs reception processing. In the reception time period, the reception processing section 7 performs reception processing without attenuating the reception signal 112. In other words, the reception processing section 7 amplifies the attenuated return signal 107 or the reception signal 112, and performs down-conversion, orthogonal demodulation processing, and digital conversion processing as in the case of the feedback processing section 6.

In the transmission time period in the TDD system, the delay adjustment part 81 receives the feedback signal, into which the return signal has leaked and which has been subjected to reception processing by the feedback processing section 6, and the return signal, which has been subjected to reception processing by the reception processing section 7. The delay adjustment part 81 performs timing adjustment so that the timing of the feedback signal and the timing of the return signal will coincide with each other. For example, which timing is earlier, the delay of the signal whose timing is the earlier timing is adjusted so that the timing of the feedback signal and the timing of the return signal will coincide with each other.

In the transmission time period in the TDD system, regarding the feedback signal and the return signal which have been subjected to timing adjustment by the delay adjustment part 81 so that the timing of the feedback signal and the timing of the reception signal have coincided with each other, the vector adjustment part 82 adjusts the phase and level of the return signal 107 which has been subjected to reception processing by the reception processing section 7 so that the phase and level of the return signal 107 will coincide with those of the return signal 108 which has leaked into the feedback signal. For example, adjustment of the phase of the return signal is performed by a phase shifter, and adjustment of the level of the return signal is performed by an attenuator. A phase shift amount and a level amount are set in advance. The phase adjustment and the level adjustment may be performed so that the phase shift amount and the level amount will be added into initialization values (default values) of a phase shift adjustment amount and a level adjustment amount, respectively.

Note that, as the default values of the phase shift adjustment amount and the level adjustment amount, a phase shift amount for phase adjustment using the phase shifter and an attenuation for level adjustment using the attenuator are set in advance in consideration of phase conditions and level conditions based on design conditions including conditions for placing the antenna.

The signal combining part 83 combines, with the feedback signal, the return signal that has been adjusted by the vector adjustment part 82. The timing, phase, and level of the return signal that has leaked into the feedback signal and the timing, phase, and level of the return signal that has been subjected to reception processing are adjusted by the delay adjustment part 81 and the vector adjustment part 82. Thus, by combining, with the feedback signal, the return signal that has been subjected to reception processing, the signal combining part 83 removes the return signal that has leaked into the feedback signal.

The feedback control section 20 compares, with the level of the transmission signal that has been input, the level of the feedback signal that has been combined by the signal combining part 83 to obtain a comparison result. The feedback control section 20 feeds back the comparison result to the delay adjustment part 81 for timing adjustment and to the vector adjustment part 82 for vector adjustment. (In FIG. 5, signal lines with the dotted line indicate adjustment feedback signals that are supplied from the feedback control section 20 to the delay adjustment part 81 and the vector adjustment part 82.) In the transmission time period using the TDD system illustrated in FIG. 1, after adjustment has been performed as described above, the feedback control section 20 calculates and updates, in accordance with the comparison result, the distortion compensation data that are stored in the distortion compensation table. Note that processing performed by the feedback control section 20 including processing performed by the delay adjustment part 81, the vector adjustment part 82, and the signal combining part 83 may be performed by a processor such as a digital signal processor (DSP).

Figure 6:
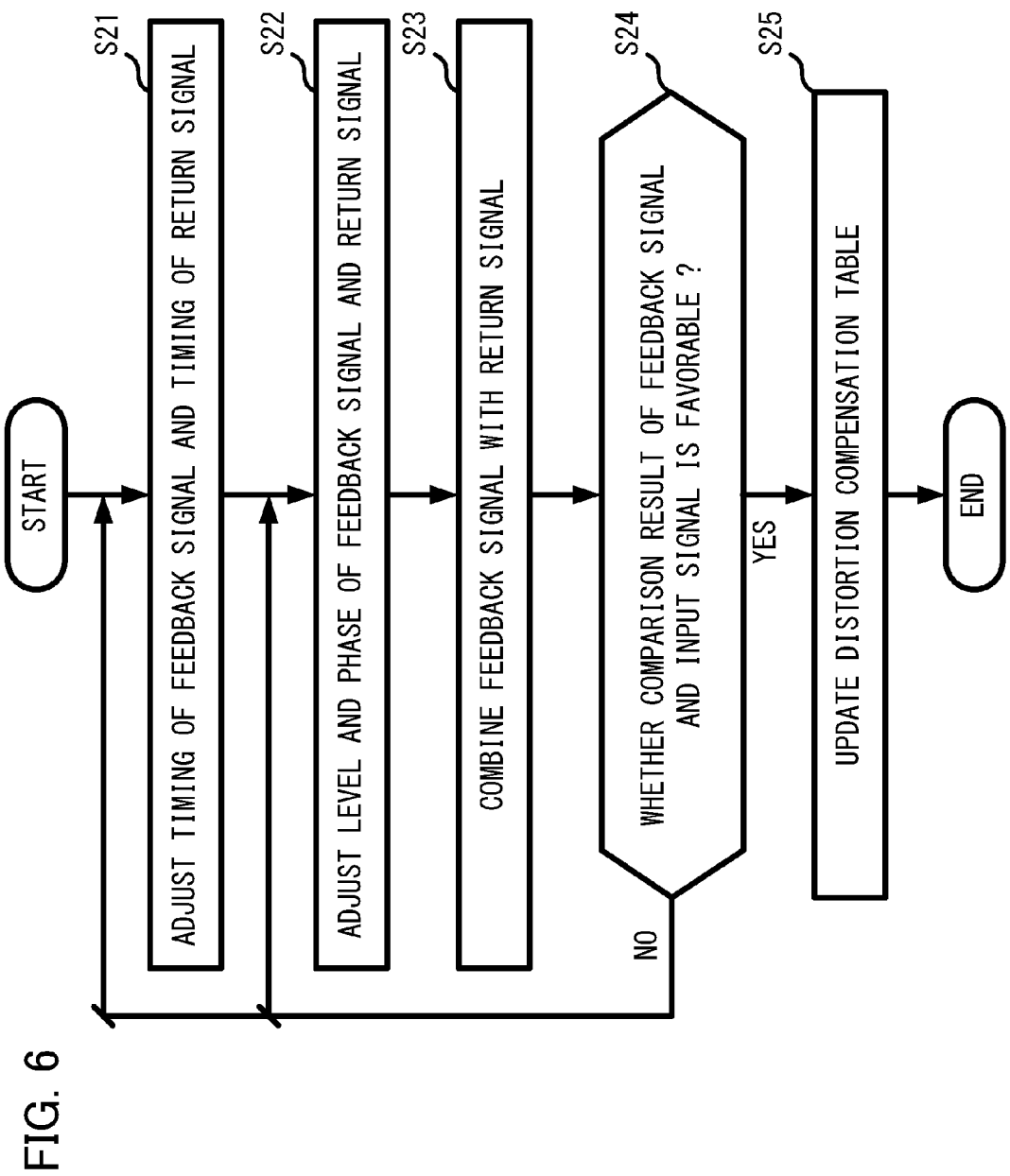
FIG. 6 is a flowchart of a distortion compensation flow for explaining a distortion compensation method for the wireless apparatus used on the TDD system according to the second embodiment.

FIG. 6 is a flowchart of a distortion compensation flow for explaining a distortion compensation method for the wireless apparatus used on the TDD system.

S21: The delay adjustment part 81 illustrated in FIG. 5 adjusts the timing of the feedback signal processed by the feedback processing section 6 and the timing of the return signal processed by the reception processing section 7. For example, which timing is earlier, the delay of the signal whose timing is the earlier timing is adjusted so that the timing of the feedback signal and the timing of the return signal will coincide with each other.

S22: Regarding the feedback signal and the return signal subjected to reception processing whose timings have been favorably adjusted in step S21, the vector adjustment part 82 adjusts the level and phase of the return signal subjected to reception processing so that the level and phase of the return signal subjected to reception processing will coincide with those of the return signal which has leaked into the feedback signal. For example, a phase shift amount and a level amount are set in advance. The phase adjustment and the level adjustment are performed so that the phase shift amount and the level amount will be added into initialization values (default values) of a phase shift adjustment amount and a level adjustment amount, respectively.

S23: The signal combining part 83 combines the feedback signal with the return signal that has been adjusted in step S22, thereby the return signal that has leaked into the feedback signal is removed.

S24: The feedback control section 20 compares, with the transmission signal that has been input, the feedback signal that has been combined in step S23 to obtain a comparison result. The feedback control section 20 determines whether or not the comparison result (comparison characteristics) is favorable. For example, the feedback control section 20 determines whether or not the comparison result satisfies with predetermined comparison characteristics. When favorable comparison characteristics are not obtained, first, the flow returns to step S22. In step S22, level adjustment and phase adjustment (vector adjustment) are performed, and whether or not the comparison characteristics are favorable is determined. When favorable comparison characteristics are not obtained with vector adjustment, the flow returns to step S21. In step S21, timing adjustment is performed. In contrast, when favorable comparison characteristics are obtained, the flow proceeds to step S25.

S25: The feedback control section 20 calculates and updates, in accordance with the comparison result obtained in step S24, the distortion compensation data that are stored in the distortion compensation table.

Note that, the predetermined characteristics in step S24 are characteristics having a certain range. However, the following case is supposed: in step S24, the flow returns to step S21 and timing adjustment is performed again; the flow returns to step S22 and vector adjustment is performed; and, even with timing adjustment and vector adjustment, satisfactory comparison characteristics are not obtained. In an abnormal case such as the above case, the feedback control section 20 generates an alarm, and finishes the flow without performing updating of the distortion compensation table in step S25.

The above-described control in the distortion compensation flow is performed in the transmission time period in the TDD system. Control including control of feeding back the comparison result to the delay adjustment part 81 and the vector adjustment part 82, control of combing the feedback signal with the reception signal using the signal combining part 83, determination of the comparison result, and control performed for the abnormal case that is described above as one example may be performed by a processor such as a DSP.

Hereinafter, more detailed functional blocks of the wireless apparatus using the TDD system will be described.

Figure 7:
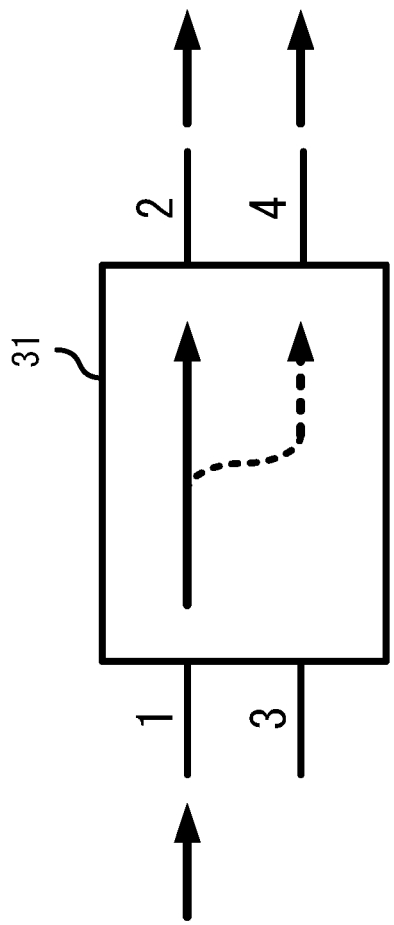
FIG. 7 is a diagram for explaining a directional coupler.

FIG. 7 is a diagram for explaining a directional coupler. It is preferable that a directional coupler 31 be used as the splitter 3. The directional coupler 31 transfers, to a terminal 2, a signal that has been input to a terminal 1. The directional coupler 31 splits the signal that has been input to the terminal 1, and transfers, to a terminal 4, one portion of the signal that has been input to the terminal 1. When the directional coupler 31 is applied as the splitter 3 illustrated in FIG. 3 or FIG. 5, the transmission signal 101 transferred from the distortion compensation amplifier 1 is input to the terminal 1. The transmission signal 103 to be transferred to the switching section 4 is output from the terminal 2. The feedback signal 102 is output from the terminal 4. A directional coupler is managed, typically, using characteristics including an insertion loss L defined for a path from a terminal 1 to a terminal 2, a degree of coupling C defined for a path from the terminal 1 to a terminal 4, an isolation I defined for a path from the terminal 1 to a terminal 3, and a directivity D defined for a path from the terminal 4 to the terminal 3.

Figure 8:
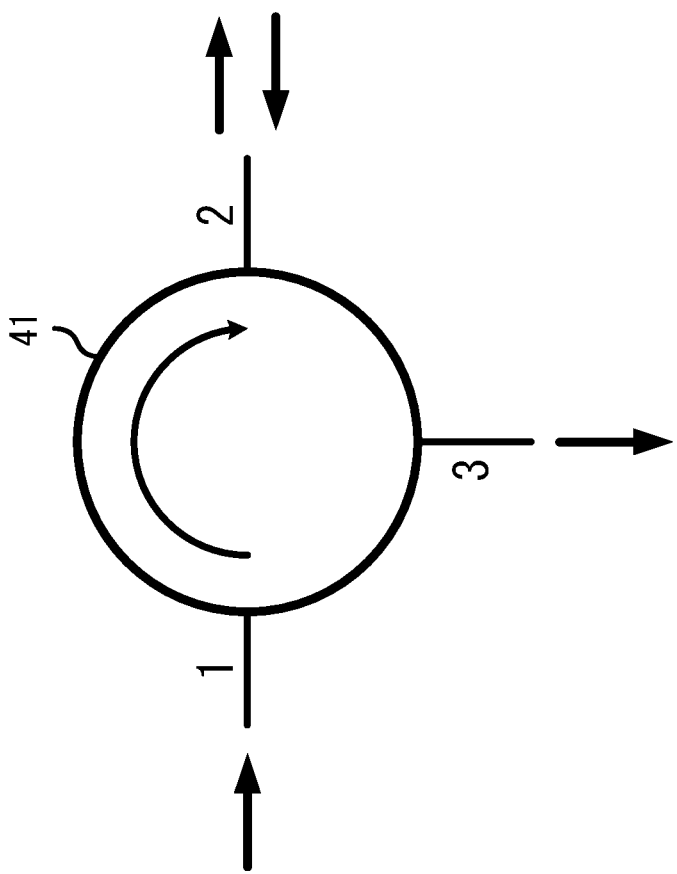
FIG. 8 is a diagram for explaining a circulator.

FIG. 8 is a diagram for explaining a circulator. It is preferable that a circulator 41 be used as the switching section 4. The circulator 41 transfers each signal in one direction so that it transfers, to a terminal 2, a signal that has been input to a terminal 1, and it transfers, to a terminal 3, a signal that has been input to the terminal 2. When the circulator 41 is applied as the switching section 4 illustrated in FIG. 3 or FIG. 5, the transmission signal 103 transferred from the splitter 3 is input to the terminal 1. The transmission signal 104 to be transferred to the antenna 5 is output from the terminal 2. The reception signal 111 received by the antenna 5 or the return signal 105 reflected by the antenna 5 is input to the terminal 2. The reception signal 111 that has been input to the terminal 2 is output from the terminal 3 as the reception signal 112 to be transferred to the reception processing section 7. The return signal 105 that has been input to the terminal 2 is output from the terminal 3 as the return signal 107 to be transferred to the reception processing section 7. A circulator is managed, typically, using characteristics including an insertion loss and a backward insertion loss.

Figure 9:
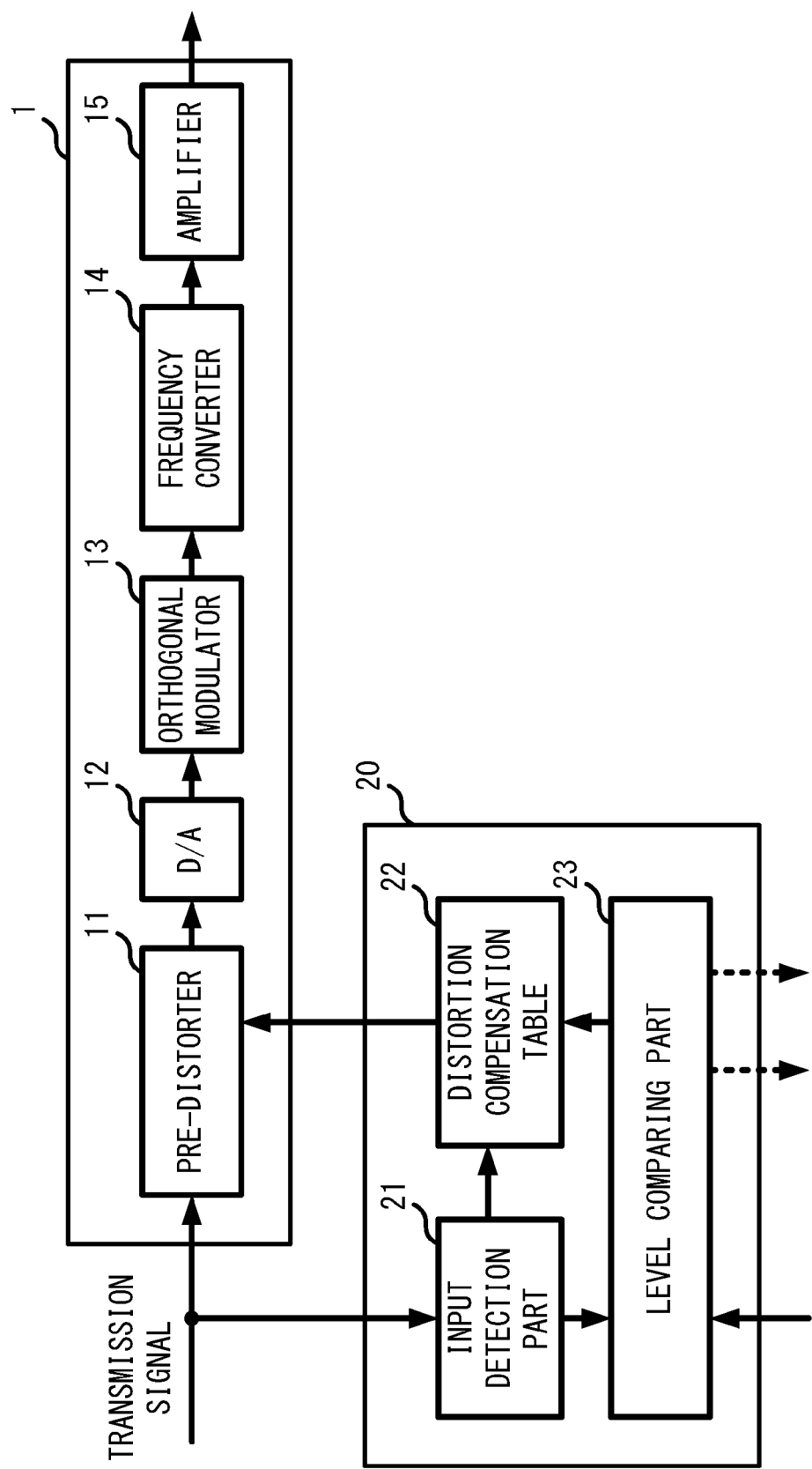
FIG. 9 is a diagram for explaining a distortion compensation amplifier and a feedback controller.

FIG. 9 is a diagram for explaining a distortion compensation amplifier and a feedback controller. The distortion compensation amplifier 1 illustrated in FIG. 3 or FIG. 5 and the feedback controller 20 illustrated in FIG. 5 will be described in detail with reference to FIG. 9.

For example, the transmission signal constituted by I and Q signals that are to be subjected to orthogonal modulation is input to an input detection part 21. The input detection part 21 detects a level of the transmission signal that has been input. Note that the transmission signal is a signal that is to be transmitted in the transmission time period described with reference to FIG. 1. A distortion compensation table 22 is notified of the level of the transmission signal that has been detected by the input detection part 21. A distortion compensation data corresponding to the level of the transmission signal is read from the distortion compensation table 22 (the distortion compensation table section 2 illustrated in FIG. 3), and supplied to a pre-distorter 11.

The pre-distorter 11 corrects, using the distortion compensation data corresponding to the level of the transmission signal, the transmission signal that has been input.

A digital-to-analog (D/A) converter 12 converts, into an analog signal, the transmission signal that has been corrected by the pre-distorter 11.

An orthogonal modulator 13 performs orthogonal modulation, using a reference carrier wave and using a carrier wave having a phase that is shifted by 90 degrees from the phase of the reference carrier wave, on the transmission signal (constituted by the I and Q signals) that is an analog signal obtained by conversion performed by the D/A converter 12.

A frequency converter 14 performs frequency conversion (up-conversion) to convert, into a signal in a wireless frequency band, the transmission signal that has been modulated by the orthogonal modulator 13.

An amplifier 15 amplifies the transmission signal which has been up-converted by the frequency converter 14 so that the transmission signal will have a predetermined power level.

The input detection part 21 detects the level of the transmission signal that has been input, and notifies the distortion compensation table 22 and a level comparing part 23 of an information item concerning the detected level.

The distortion compensation table 22 stores distortion compensation data corresponding to levels of the transmission signal. The distortion compensation table 22 supplies, to the distortion compensation amplifier 1, the distortion compensation data corresponding to the level of the transmission signal notified from the input detection part 21. Furthermore, the distortion compensation table 22 calculates, in accordance with a comparison information item notified from the level comparing part 23, the distortion compensation data for nonlinear distortion characteristics that changed because of changes which occurred in a transmission amplifier (the amplifier 15) over time. The distortion compensation table 22 updates the distortion compensation data.

The level comparing part 23 performs comparison processing, i.e., compares, with the level of the feedback signal that has been subjected to combining processing by the signal combining part 83 illustrated in FIG. 5, the level of the transmission signal that has been detected by the input detection part 21 to obtain a comparison result. The comparison processing is performed in the transmission time period described with reference to FIG. 1. The comparison result is fed back to the delay adjustment part 81 and the vector adjustment part 82 that are illustrated in FIG. 5. The distortion compensation table 22 is notified of an information item with which the comparison result will be made favorable, e.g., a comparison information item with which the difference between the level of the transmission signal and the level of the feedback signal will be reduced.

Figure 10:
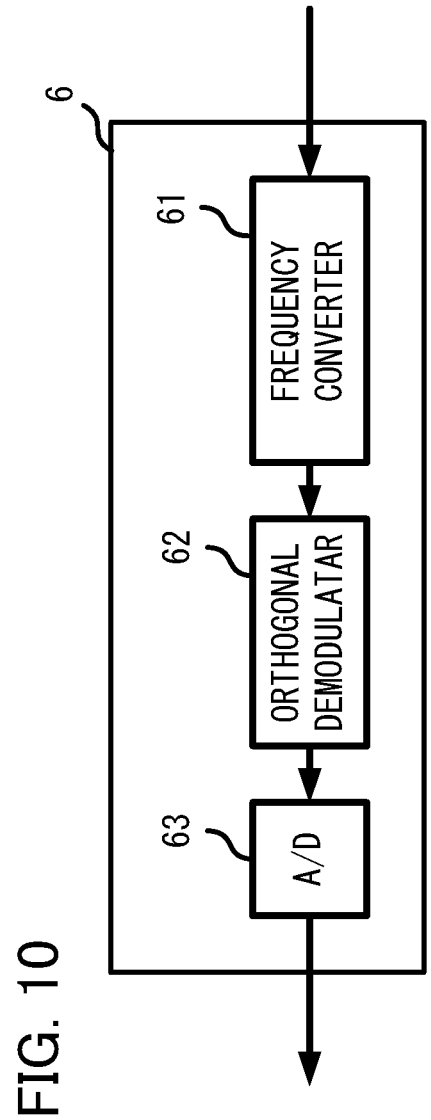
FIG. 10 is a diagram for explaining a feedback processing section.

FIG. 10 is a diagram for explaining a feedback processing section. The feedback processing section 6 illustrated in FIG. 3 or FIG. 5 will be described in detail with reference to FIG. 10.

The transmission signal 102 (hereinafter, described as a "feedback signal" in some cases) that is one portion of the transmission signal obtained by splitting performed by the splitter 3 illustrated in FIG. 3 or FIG. 5 is input to a frequency converter 61.

The frequency converter 61 performs frequency conversion (down-conversion) to convert the feedback signal in the wireless frequency band into a signal in a predetermined frequency band.

An orthogonal demodulator 62 performs orthogonal demodulation, using a reference carrier wave and using a carrier wave having a phase that is shifted by 90 degrees from the phase of the reference carrier wave, on the feedback signal that has been down-converted by the frequency converter 61.

An A/D converter 63 converts, into a digital signal, the feedback signal (constituted by I and Q signals) that has been demodulated by the orthogonal demodulator 62. The feedback signal that is a digital signal obtained by conversion is transferred to the delay adjustment part 81 illustrated in FIG. 5 (the combining section 8 illustrated in FIG. 3).

Figure 11:
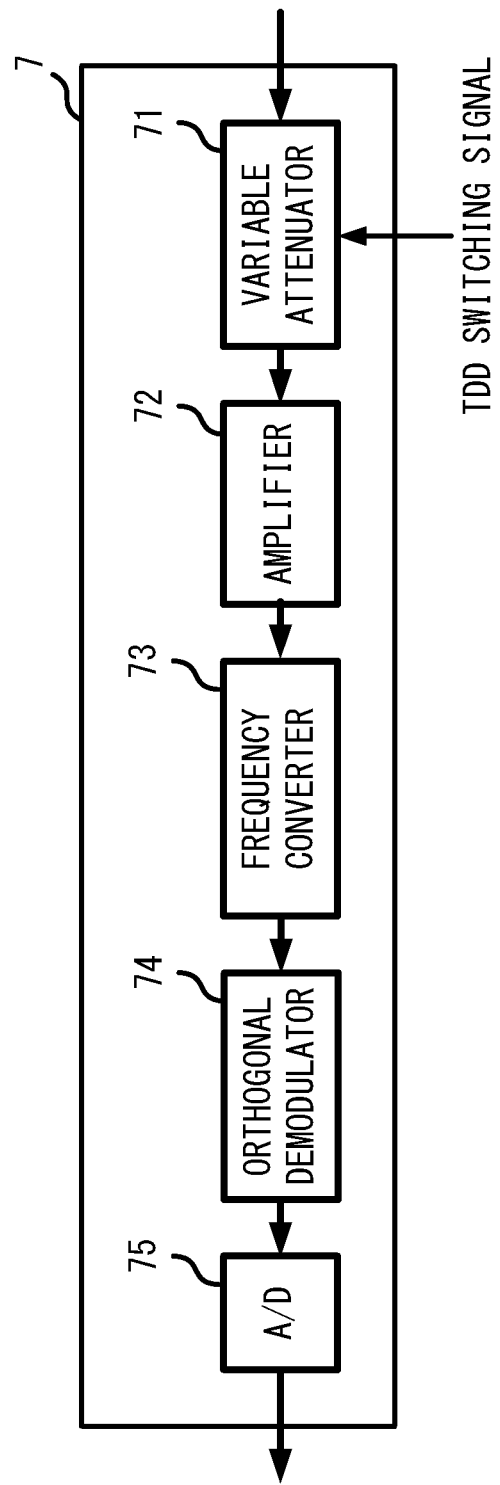
FIG. 11 is a diagram for explaining a reception processing section.

FIG. 11 is a diagram for explaining a reception processing section. The reception processing section 7 illustrated in FIG. 3 or FIG. 5 will be described in detail with reference to FIG. 11.

In the TDD system described with reference to FIG. 1, in the transmission time period, the switching section 4 described with reference to FIG. 3 or FIG. 5 transfers, to a variable attenuator 71, the signal (the return signal) that has occurred because the transmission signal has been reflected by the antenna 5. In the reception time period, the switching section 4 transfers, to the variable attenuator 71, the reception signal that has been received by the antenna 5.

For example, it is supposed that transmission power for the transmission signal 104 illustrated in FIG. 3 or FIG. 5 is 10 W (40 dBm). It is supposed that the lowest level of a signal that the wireless apparatus receives is −90 dBm. It is considered that the worst (highest) level of a signal (the return signal) which occurs because the transmission signal is reflected by the antenna 5 is 30 dBm.

In this case, supposing that the insertion loss of the switching section 4 is 0 dB (approximately 1 dB in reality), the level of a signal that the switching section 4 transfers to the variable attenuator 71 is 30 dBm (the level of the return signal) in the transmission time period, and is −90 dBm (the level of the reception signal) in the reception time period.

Note that, supposing that the backward insertion loss of the switching section 4 is 20 dB and the backward insertion loss of the splitter 3 is 60 dB, it is considered that the level of the return signal which is to leak into the feedback signal 102 (supposing that the level of the feedback signal 102—10 dBm) is −50 dBm.

In the transmission time period, when the level of the return signal is the lowest, the return signal having the worst level of 30 dBm is input to the variable attenuator 71 illustrated in FIG. 11. In the reception time period, when the level of the reception signal is the lowest, the reception signal having the lowest level of −90 dBm is input to the variable attenuator 71. An amplifier (a low noise amplifier (LNA)) 72 that is provided at the next stage to the variable attenuator 71 is designed so that the amplifier 72 processes the reception signal having a low level, e.g., the lowest level of approximately −90 dBm. Accordingly, in order to prevent the amplifier 72 from being damaged from the return signal having a high level in the transmission time period, the variable attenuator 71 attenuates the return signal in the transmission time period in accordance with a TDD switching signal with which the transmission time period and the reception time period are distinguished from each other. The amplifier 72 provided at the next stage and the parts subsequent thereto perform the same reception processing on both the reception signal and the return signal. Accordingly, the attenuation of the variable attenuator 71 is set to a predetermined attenuation with which the return signal is attenuated so that the level of the return signal will be as low as the level of the reception signal.

In the transmission time period, the amplifier 72 amplifies the return signal so that the return signal will have a predetermined level. In the reception time period, the amplifier 72 amplifies the reception signal so that the reception signal will have the predetermined level.

A frequency converter 73 down-converts the amplified return signal or reception signal into a signal in a predetermined frequency band.

An orthogonal demodulator 74 performs orthogonal demodulation, using a reference carrier wave and using a carrier wave having a phase that is shifted by 90 degrees from the phase of the reference carrier wave, on the return signal or reception signal that has been subjected to frequency conversion by the frequency converter 73.

An A/D converter 75 converts, into a digital signal, the return signal or reception signal (constituted by I and Q signals) that has been demodulated by the orthogonal demodulator 74. The return signal that is a digital signal obtained by conversion is transferred to the delay adjustment part 81 illustrated in FIG. 5 (the combining section 8 in FIG. 3). Furthermore, the reception signal that is a digital signal obtained by conversion is transferred to a block (not illustrated) that is provided at the next stage and that is to process the reception signal.

According to the second embodiment, using the reception processing section that processes the reception signal in the reception time period in the TDD system, reception processing is performed on the return signal in the transmission time period, whereby the return signal that is a signal reflected by the antenna is identified. The identified return signal is combined with the feedback signal in the distortion compensation loop. The comparison characteristics obtained by comparing the combined feedback signal with the transmission signal that has been input are fed back to the delay adjustment part and the vector adjustment part, whereby timing adjustment and vector adjustment are performed until favorable comparison characteristics are obtained. Accordingly, the return signal that has leaked into the feedback signal is removed, and the distortion compensation data is prevented from being incorrectly updated using the return signal that has leaked into the distortion compensation loop.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A wireless apparatus in which a distortion compensation loop is formed so as to compensate nonlinear distortion of a transmission amplifier, being used on a time division duplex system on which a wireless signal is transmitted in a transmission time period with same frequency as being received, the wireless apparatus used on the time division duplex system comprising:

a distortion compensation amplifier to perform a compensation of a transmission signal by using characteristics inverse to characteristics of nonlinear distortion of the transmission signal amplified by a transmission amplifier and transmit the compensated transmission signal;

a splitter to split the transmission signal compensated by the distortion compensation amplifier into the transmission signal transferred in a transmission direction toward an antenna and the transmission signal in a direction toward the distortion compensation loop;

a feedback processing section to perform a reception processing on the transmission signal split by the splitter;

a reception processing section to perform the reception processing on a signal in a reception direction from the antenna;

a switching section to transfer the compensated transmission signal split by the splitter to the transmission direction and to transfer the signal in the reception direction from the antenna to the reception processing section;

a delay adjustment part to adjust timings of a feedback signal and a return signal processed by the reception unit in the transmission time period when the transmission signal is transmitted in the transmission direction;

a vector adjustment part to adjust phases and levels of the feedback signal and the return signal adjusted by the delay adjustment part in the transmission time period;

a signal combining part to combine the feedback signal and the return signal adjusted by the vector adjustment part in the transmission time period; and a feedback controller to update distortion compensation data stored in a distortion compensation table included in the distortion compensation amplifier, in accordance with characteristics of the signal combined by the signal combining part and the transmission signal input to the distortion compensation amplifier, in the transmission time period, wherein:

the feedback controller includes:

an input detection part to detect a signal level of the input transmission signal; and the distortion compensation table in which the distortion compensation data used to compensate the input transmission signal based on the input signal level detected by the input detection part are stored;

the distortion compensation amplifier includes:

a pre-distorter to compensate the input transmission signal in accordance with the distortion compensation data read out from the distortion compensation table based on the input signal level;

a D/A converter to convert the input transmission signal to an analog signal thereof;

an orthogonal modulator to orthogonally transform the input transmission signal converted by the D/A converter;

a frequency converter to covert a frequency of the signal orthogonally transformed by the orthogonal modulator; and an amplifier to amplify power of the transmission signal with the frequency converted by the frequency converter;

the feedback processing section includes:

a frequency converter to convert a frequency of the feedback signal from the splitter;

an orthogonal demodulator to perform orthogonal demodulation of the feedback signal with the frequency converted by the frequency converter; and an A/D converter to convert the feedback signal demodulated by the orthogonal demodulator to a digital signal thereof and transmit the feedback signal converted by the A/D converter to the delay adjustment part; and the reception processing section includes:

a variable attenuator to attenuate variably the signal in the reception direction in the transmission time period;

an amplifier to amplify the signal from the variable attenuator;

a frequency converter;

an orthogonal demodulator; and an A/D converter;

wherein the frequency converter, the orthogonal demodulator and the A/D converter have characteristics equivalent to the feedback processing section processing the signal amplified by the amplifier, respectively.

2. The wireless apparatus according to claim 1, wherein the transmission signal in the transmission direction from the switching section are transferred to the antenna through a feeding line having a characteristic impedance matching with the characteristic impedance of the antenna.

* * * * *